United States Patent
Hartung

(10) Patent No.: US 7,307,840 B2
(45) Date of Patent: Dec. 11, 2007

(54) CROSS-FLOW REDUNDANT AIR COOLING METHOD FOR HIGH RELIABILITY ELECTRONICS

(75) Inventor: David Hartung, Belmont, MI (US)

(73) Assignee: Smiths Aerospace LLC, Grand Rapids, MI (US)

( * ) Notice: Subject to any disclaimer, the term of this patent is extended or adjusted under 35 U.S.C. 154(b) by 221 days.

(21) Appl. No.: 11/249,263

(22) Filed: Oct. 14, 2005

(65) Prior Publication Data

US 2007/0086161 A1  Apr. 19, 2007

(51) Int. Cl.
*H05K 7/20* (2006.01)
(52) U.S. Cl. .................. 361/695; 361/690; 361/694; 165/80.2; 165/104.33; 454/184
(58) Field of Classification Search .............. None
See application file for complete search history.

(56) References Cited

U.S. PATENT DOCUMENTS

| | | | | |
|---|---|---|---|---|
| 4,089,040 A | * | 5/1978 | Paulsen | 361/691 |
| 4,674,704 A | * | 6/1987 | Altoz et al. | 244/1 R |
| 4,851,965 A | * | 7/1989 | Gabuzda et al. | 361/691 |
| 5,940,266 A | * | 8/1999 | Hamilton et al. | 361/695 |
| 5,940,288 A | * | 8/1999 | Kociecki | 363/144 |
| 6,459,579 B1 | * | 10/2002 | Farmer et al. | 361/695 |
| 6,735,080 B1 | * | 5/2004 | Chang | 360/695 |
| 6,940,718 B2 | * | 9/2005 | Gedamu et al. | 361/695 |
| 7,068,506 B2 | * | 6/2006 | Behl | 361/695 |
| 2007/0070601 A1 | * | 3/2007 | Vos et al. | 361/694 |

* cited by examiner

*Primary Examiner*—Boris Chervinsky
(74) *Attorney, Agent, or Firm*—Foley and Lardner LLP

(57) ABSTRACT

An electronic assembly cooling system including a module case assembly that has a module case wall. The system includes a first and second air driver and an electronic assembly located in-front of the module case wall. The system conducts thermal energy from the electronic assembly from in-front of the module case wall to in-back of the module case wall, and directs air driven by the first air driver past the module case wall in-front of the module case wall to cool the electronic assembly via convective heat transfer. The system directs air driven by the second air driver past the module case wall in-back of the wall to transfer the thermal energy conducted from the electronic assembly from in-front of the module case wall to in-back of the module case wall to the air driven by the second air driver via conductive heat transfer to cool the electronic assembly.

20 Claims, 13 Drawing Sheets

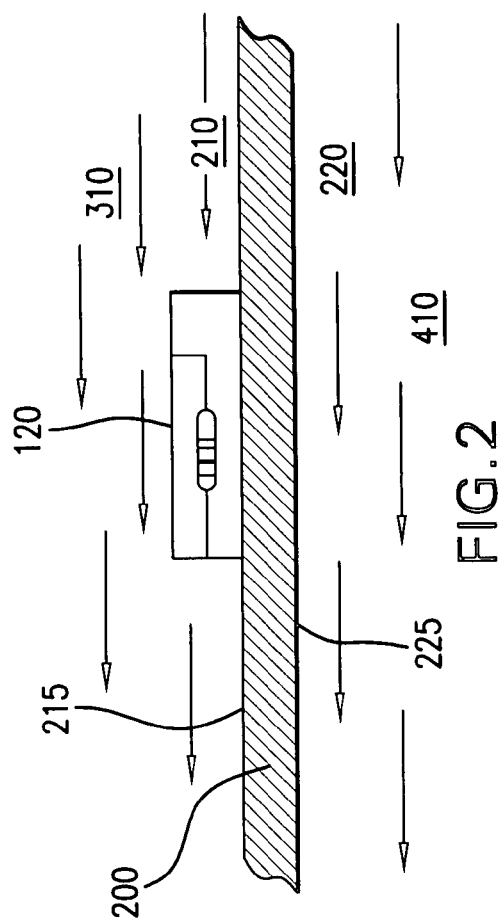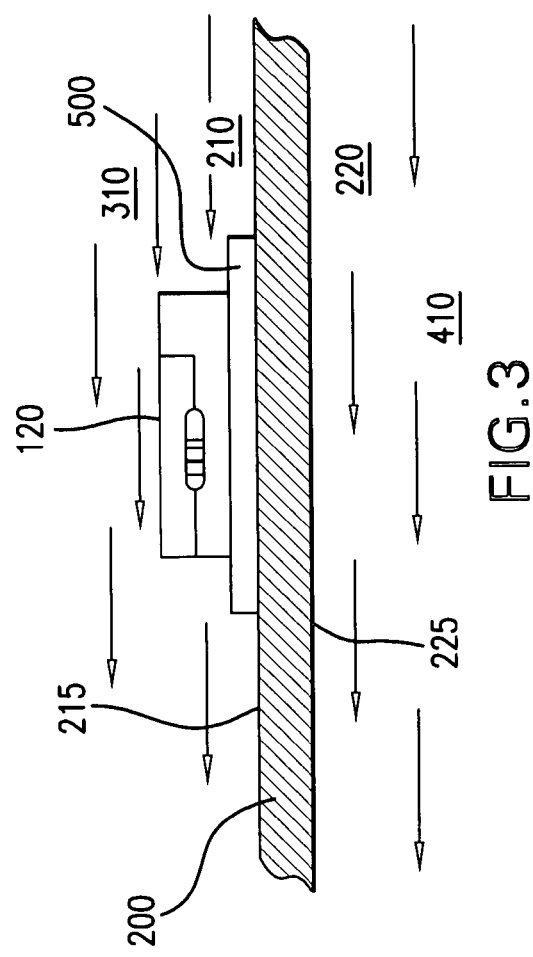

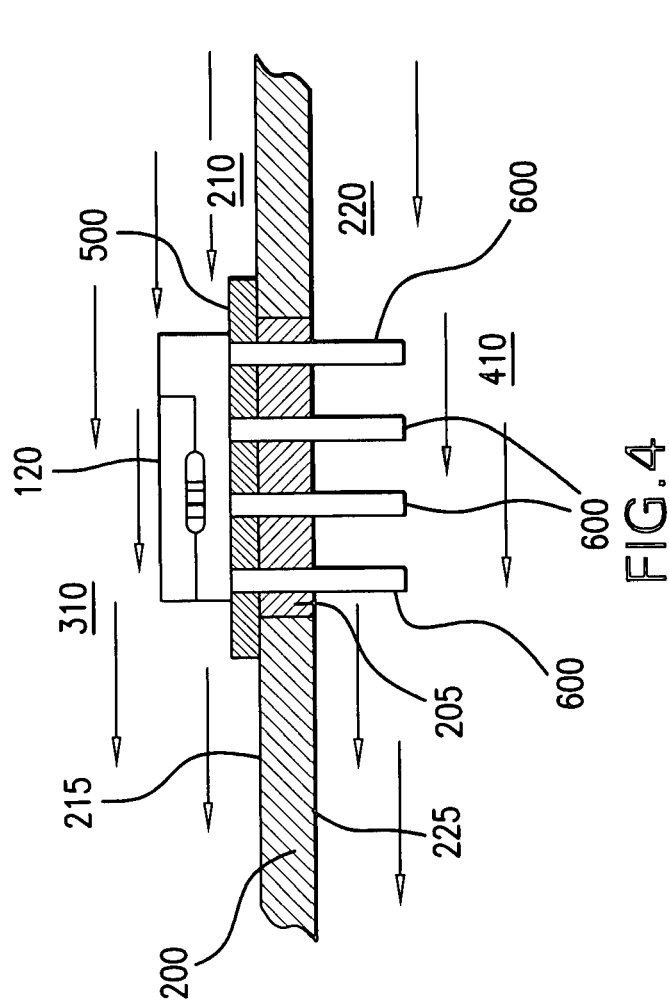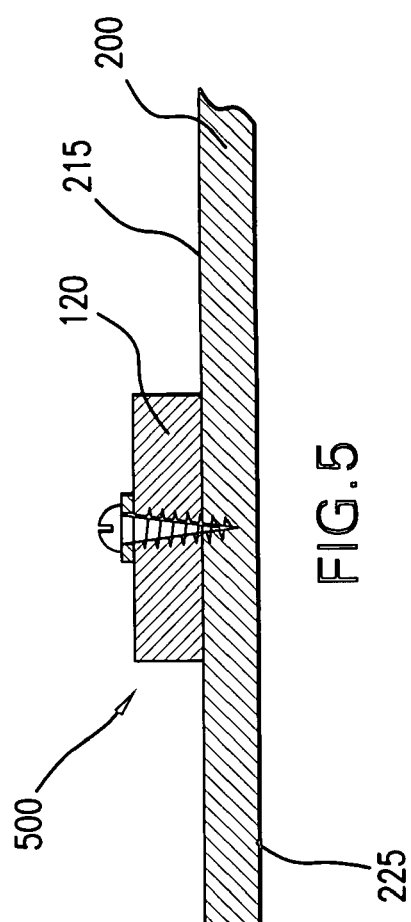

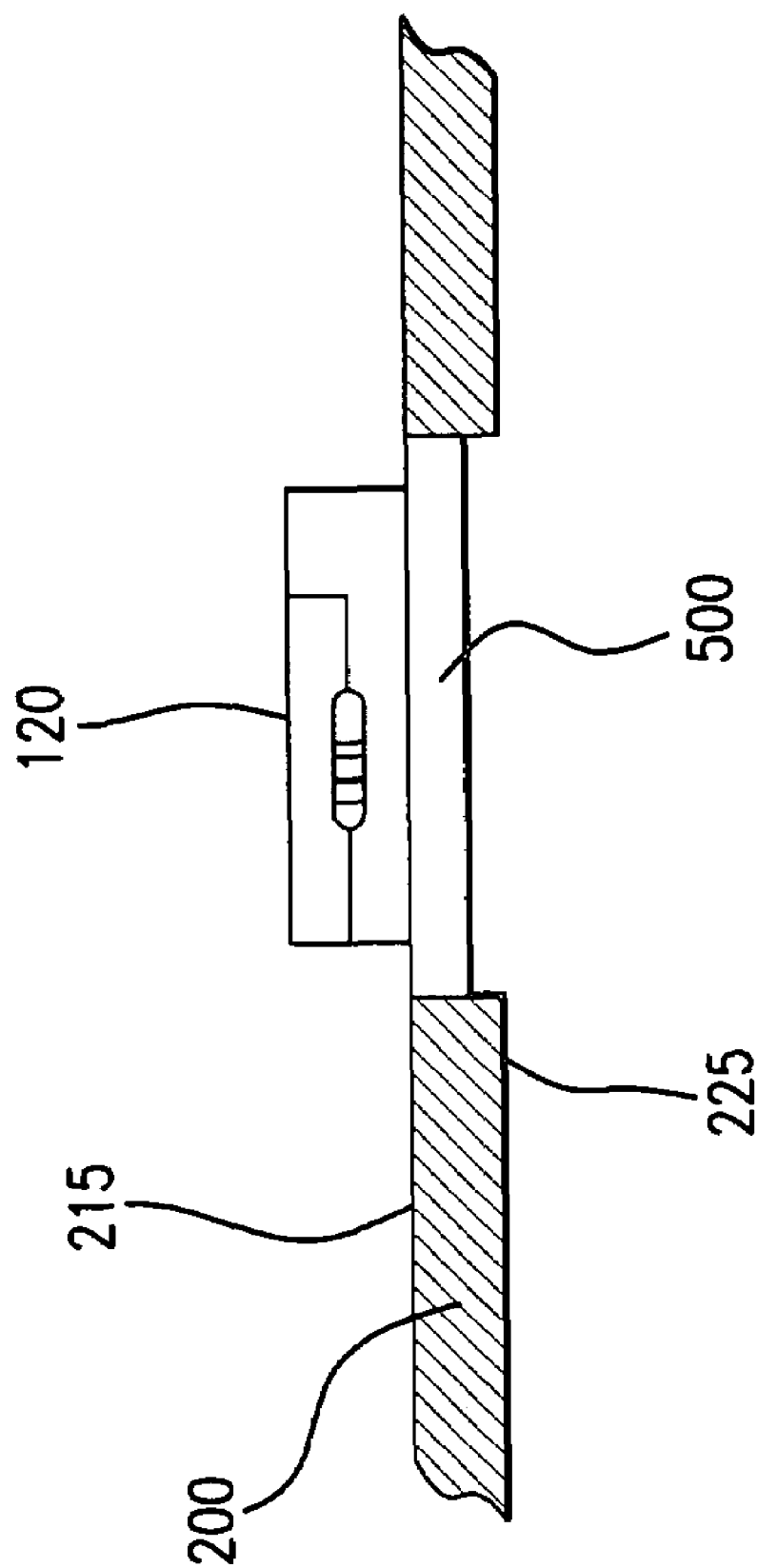

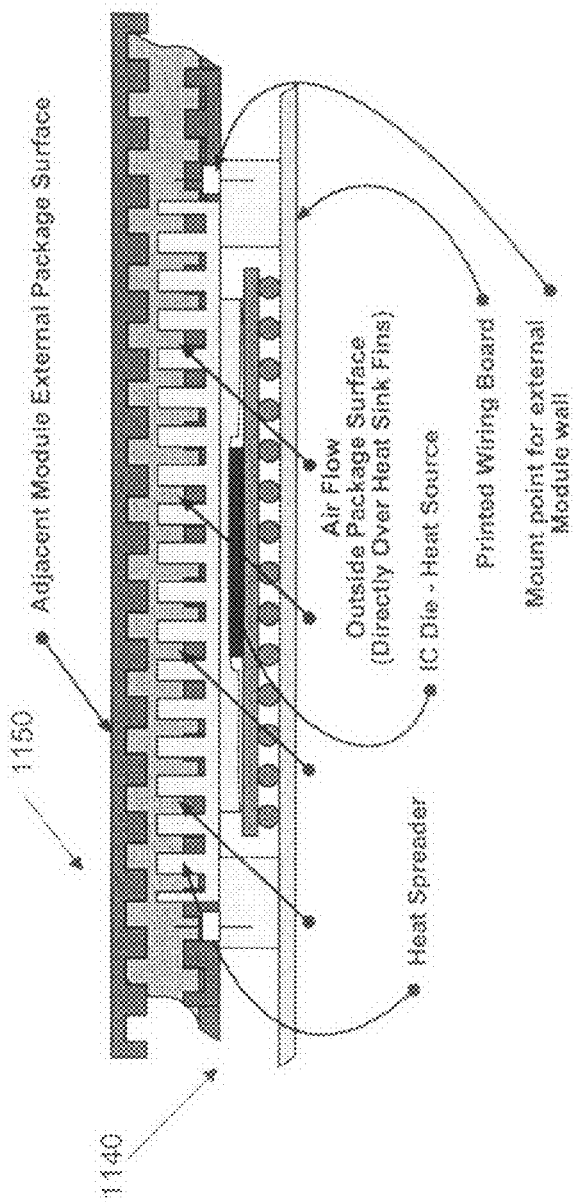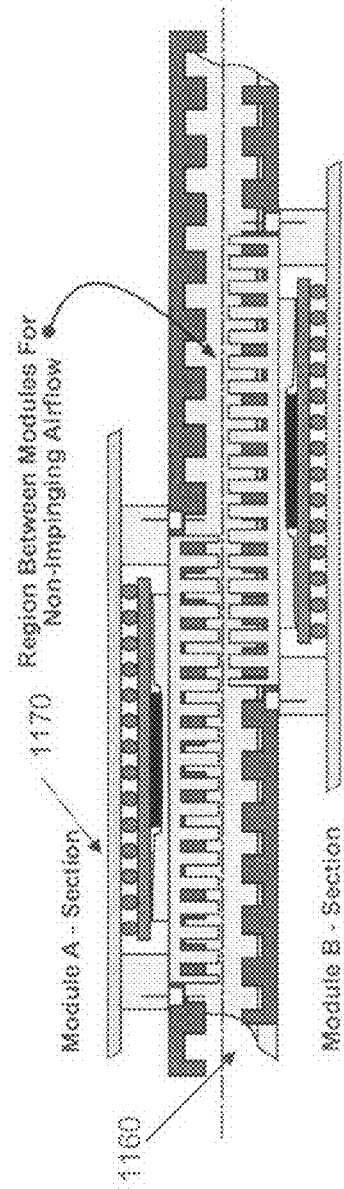
Fig. 14
Fig. 15

CROSS-FLOW REDUNDANT AIR COOLING METHOD FOR HIGH RELIABILITY ELECTRONICS

CROSS-REFERENCE TO RELATED APPLICATIONS

This application relates to U.S. patent application Ser. No. 11/249,258, entitled Method for Electronics Equipment Cooling Having Improved EMI Control and Reduced Weight, by David Hartung, filed on the same date as this application, the contents of which are incorporated herein by reference in their entirety.

BACKGROUND OF THE INVENTION

Electronic assemblies, including high power dissipating integrated circuits, generate heat during operation. It is typically necessary to dissipate this heat or, more accurately, transfer the thermal energy away from the electronic assembly to ensure that the electronic assembly will not overheat and thus fail due to degradation of some or all of the circuits in the assembly. In some applications, mere thermal radiation and component-induced convection of free-standing air may be used to effectively "cool" the electronic assembly. Still further, structures such as heat sinks may be used to conduct the thermal energy away from the electronic assemblies.

However, some electronic assemblies are of such a design and/or some electronic assemblies are utilized in close proximately to other electronic assemblies and/or in ambient environments such that it is not possible to dissipate or otherwise transfer sufficient amounts of thermal energy away from the electronic assembly to ensure that the electronic assembly will not overheat during use without utilizing an air stream that is directed over the electronic assembly to obtain convective heat transfer of thermal energy away from the electronic assembly into the air stream. For example, compact main frame computers often utilize cooling fans to draw air into the interior of the computer where the electronic components are housed. Cooling fans or other methods of inducing air flow over electronic components are often used to cool electronic assemblies utilized on commercial and/or military aircraft. In this regard, a typical modem commercial aircraft has a tremendous amount of highly sophisticated electronic components within, for example, the fuselage of the aircraft. Because space is limited on an aircraft, these components are typically bunched together such that a cooling air stream/air flow is needed to cool the electronic assemblies to ensure that they do not overheat in the ambient temperatures to which they are exposed. (Interior portions of an aircraft fuselage may become very hot, especially when sitting in the sun on a runway in the southern latitudes.)

SUMMARY OF THE INVENTION

The present inventor has determined that in the event that if the flow of air across/over the electronic assemblies ceases or is reduced (e.g., due to a failure of a cooling fan or other air driver), the electronic assemblies may overheat and fail or it may be necessary to shut down the electronic assemblies to avoid damaging the assemblies. Such a situation is typically unacceptable while an aircraft is in the air. Notwithstanding this fact, utilizing air flow to cool electronic assemblies is desirable. Thus, the present inventor has determined that there is a need to develop an electronic assembly cooling system that ensures that the electronic assemblies will not overheat in the event that the device creating the air flow over/across the electronic assemblies fails and/or the air flow is otherwise halted or effectively reduced.

According to an embodiment of the present invention, there is an electronic assembly cooling system, comprising a module case assembly including a module case wall, a first air driver, a second air driver, and an electronic assembly located in-front of the module case wall, wherein the electronic assembly cooling system is adapted to conduct thermal energy from the electronic assembly from in-front of the module case wall to in-back of the module case wall, wherein the electronic assembly cooling system is adapted to direct air driven by the first air driver past the module case wall in-front of the module case wall to effectively cool the electronic assembly via convective heat transfer, and wherein the electronic assembly cooling system is adapted to direct air driven by the second air driver past the module case wall in-back of the module case wall to transfer the thermal energy conducted from the electronic assembly from in-front of the module case wall to in-back of the module case wall to the air driven by the second air driver via conductive heat transfer to effectively cool the electronic assembly.

BRIEF DESCRIPTION OF THE DRAWINGS

FIG. 2 shows a close-up view of the wall of FIG. 1.

FIG. 3 shows another embodiment of the present invention utilizing a support.

FIG. 4 shows another embodiment of the present invention utilizing a support and utilizing fins.

FIG. 5 shows another embodiment of the present invention utilizing a support.

FIG. 6 shows another embodiment of the present invention utilizing a support.

FIGS. 11-16 present additional embodiments of the present invention.

DETAILED DESCRIPTION OF THE PREFERRED EMBODIMENTS

Figure 1:
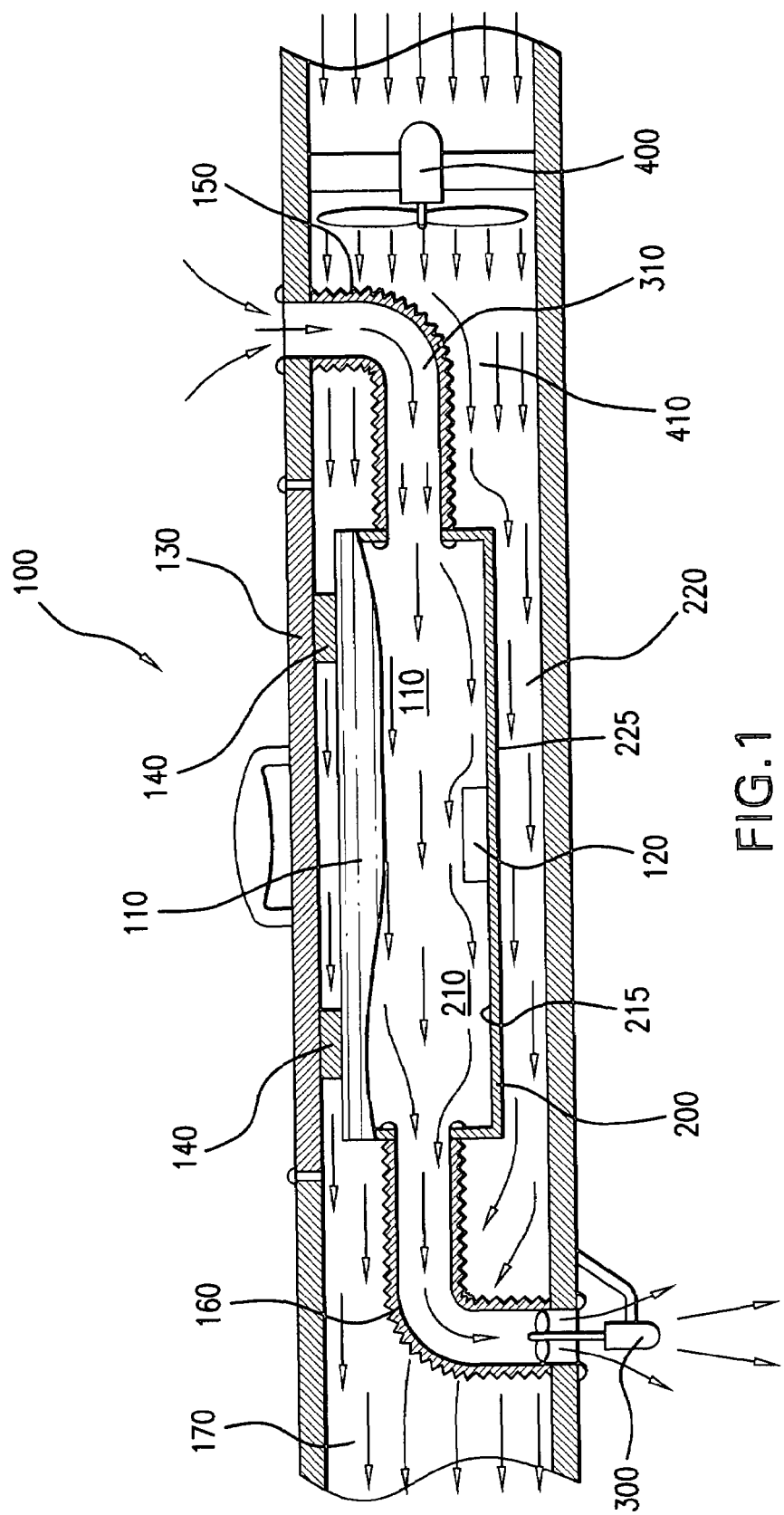
FIG. 1 shows an exemplary embodiment of the present invention as used in an air vehicle.

In a first embodiment of the present invention, as may be seen in FIG. 1, there is an electronic assembly cooling system 100 that includes a module case assembly 110 with an electronic assembly 120, such as, for example, a high power dissipating integrated circuit component, mounted on a module case wall 200. In this embodiment of the invention, the module case assembly 110 is located in an air flow passageway 170 such that air passes over/around/past some or all of the module case assembly 110. In the embodiment of FIG. 1, the high power dissipating integrated circuit/electronic assembly 120 is mounted directly on the module case wall 200, and the module case wall is configured to conduct thermal energy generated by the electronic assembly 120 through the wall 200, and, owing to the air flow 410 in the passageway 170, the electronic assembly 120 may be cooled via convective heat transfer of thermal energy (conducted from the electronic assembly 120 to the wall 200) away from the wall 200. That is, owing to the thermal conductivity properties of the wall 200 and owing to the air flow in air passageway 170 along the wall 200 that has the effect of cooling the integrated circuit via convective heat transfer (since the thermal energy of the electronic assembly 120 easily passes from, during operation, may be effectively cooled.

As may be seen in FIG. 1, ducts 150 and 160 respectively allow air to enter and exit the interior of the module case assembly 110. The air entering the duct 150 and thus entering the module case assembly 110 also has the effect of cooling the electronic assembly 120 via convective heat transfer as the air passes by the electronic assembly 120.

In the embodiment present in FIG. 1, the air flows are separate from one another, being driven by separate fans (also referred to as air drivers). Thus, if one of the two air flows were to stop or otherwise be reduced, (such as due to a failure of one of the two fans) the other air flow will still continue in a manner sufficient to effectively cool the electronic assembly 120 during operation to obtain a level of redundancy in the cooling system.

An exemplary scenario detailing how an embodiment of the present invention may be utilized will now be described, followed by a more detailed discussion of some of the embodiments of the present invention.

In a first exemplary scenario, where the embodiment of the present invention of FIG. 1 is utilized, there is a need to convectively cool a high power dissipating integrated circuit component in a manner that will permit both a primary convective cooling and a redundant and separate backup convective cooling to be utilized. In this exemplary scenario, multiple separate air flow paths are utilized to supply air to cool the integrated circuit. These paths are separated from one another and have separate air drivers to drive the air along the paths such that if one air supply were to fail, the integrated circuit would still effectively be cooled.

Referring to FIG. 1, as will be readily seen, the air passageway 170 is separate from the air passageway formed by duct 150, the interior of the module case assembly 110 and the duct 160. In a first exemplary embodiment, an air driver 400, such as a fan, drives air around all or part of the module case assembly 110, and an air driver 300, again such as a fan, drives air through the module case assembly 110. These air drivers are separate, and thus if one of these air drivers were to fail, and air were to respectively stop flowing through or around the module case assembly 110, or otherwise be reduced to a level insufficient to maintain cooling of the electronic assembly, the other air driver would continue to drive air respectively through or around the module case assembly 110. Again, in a first exemplary embodiment, the design of the electronic assembly cooling system is such that the electronic assembly 120 will be sufficiently cooled while the module case assembly is exposed to only one of the two air flows (e.g., one of the two air drivers fails).

Referring back to FIG. 1, one embodiment of the invention that may be used in this scenario includes a module case assembly 110 that is located in an air path 170 formed by, for example, an air duct onboard a commercial airliner. This module case assembly 110 may be placed into the air duct 170 by opening a duct door 130 and attaching the module case assembly 110 to the duct door 130 utilizing fittings 140.

As may be seen in FIG. 1, the module case assembly 110 rides on the duct door 130. Prior to closing the duct door 130, the module case assembly may be connected to ducts 150 and 160 (where ducts 150 and 160 may be inserted through openings through the walls of the duct 170) in an effectively air-tight fashion such that air may flow through the duct 150, through the module case assembly 110 and through the duct 160, thus entering and leaving the duct 170 without effectively "leaking" into the duct 170. Once the duct door 130 is closed, it may be sealed such that an effective air-tight seal is obtained, thus permitting air to flow along duct 170 and pass over/around the duct 150, the module case assembly 110 and the duct 160, without substantially entering any of the just mentioned components. During operation, the fans 300 and 400 drive air through and around the module case assembly 110, respectively. In this exemplary scenario, the design is such that if the air driver 400 were to fail and/or air 410 driven by the air driver 400 were to stop flowing (or significantly slow down) past the wall 200 of the module case assembly 110 for some reason (e.g., such as a massive leak or rupture in a wall of the duct 170), air 310 would still flow through the module case assembly 110 via the ducts 150 and 160 and this air flow would be effectively non-impacted by the failure of the air 410 to flow past the module case assembly 110. Conversely, in the event that, for example, the air driver 300 were to fail and thus stop driving air (or reduce the speed of air) through the module case assembly 110, this failure would not significantly negatively impact the air 410 that is being driven past the outside of the module case assembly 110. In sum, providing that the electronic assembly cooling system is designed properly, the electronic assembly 120 will still be sufficiently cooled and remain operational.

Some specifics of the various embodiments of the present invention will now be described.

FIG. 2 shows an exemplary embodiment of the module case wall 200 of the module case assembly 110 of FIG. 1. Here, the electronic assembly 120 is in effective thermal conductive communication with the module case wall 200. That is, as the electronic assembly 120 heats up due to operation, it conducts thermal energy from the electronic assembly 120 to the wall 200 (providing, of course, the temperature differences between these two components enable conduction heat transfer) in sufficient rates such that the electronic assembly 120 may be cooled due to the air flow in-back of the wall. In this embodiment, the electronic assembly cooling system is adapted to effectively conduct thermal energy from a first side 210 of the module case wall to a second side 220 of the module case wall. In the embodiment of FIG. 2, this means that thermal energy may be conducted from side 210 through surface 215 of wall 200 and through the wall 200 to side 210 of the module case wall 200. As may be seen from FIG. 2, a first air stream 410 driven by a first air driver 400 is directed past the surface 225 of the module case wall 200 on the second side 220 of the wall 200. In this embodiment, the design of the wall 200, in combination with the electronic assembly 120, is such that thermal energy may be transferred from the electronic assembly 120 through the wall 200 in a sufficient manner to effectively prevent the integrated circuit from overheating even if air flow 310 stopped or was reduced on the first side 210 of the wall 200 when sufficient air flow 410 flows on the second side 220 of the wall 200. Still further, referring to FIG. 2, an air stream 310 is directed on side 210 of the wall 200 over the integrated circuit 120 in a sufficient manner to effectively prevent the integrated circuit from overheating even if the second air stream 410 is non-existent or is reduced. Thus, in the event that one air stream fails or otherwise is reduced, the integrated circuit or other electronic assembly 120 would still not overheat.

FIG. 3 shows another embodiment of the present invention, where the electronic assembly 120 is located on an electronic assembly support 500 that is attached to the module case wall. In this embodiment, the electronic assembly cooling system is adapted to conduct thermal energy through the electronic assembly support 500 and through the module case wall 200, away from the electronic assembly support 500. In FIG. 4, fins 600 extend through the wall 200. In FIG. 4, the fins 600 connect directly to the electronic assembly 120 and pass through the support 500. However, in other embodiments of the invention, the fins 600 are not connected directly to the electronic assembly 120 but are instead connected directly to the support 500 which in turn is connected directly to the electronic assembly 120. (Note that by the phrase "connected", it is meant connected in a thermally conductive manner.) As may be seen in FIG. 4, sealing material 205 is interposed in an opening of the wall 200. In some embodiments of the present invention, sealing material 205 may be a highly thermally conductive material (e.g., a material of low thermal impedance), while in other embodiments of the present invention, it may not be a highly thermally conductive material (e.g., it may have a high thermal impedance).

It is noted that in some embodiments of the present invention, the electronic assembly support is a separate component from the wall 200, while in other embodiments of the present invention the electronic assembly support is integral with the wall 200. By way of example only and not by way of limitation, FIG. 5 shows an example of this latter version of an electronic assembly support 500.

As may be seen in FIG. 5, a screw type mechanism may be utilized in some embodiments to mount a circuit card within the module assembly. Of course, backplane/module card guides may also be utilize to ensure connector pin alignment and to protect the connector during installation. Moreover, the module assemblies may be hard mounted to a back-plane via a screw assembly, in some embodiments.

FIG. 6 shows another exemplary embodiment of the present invention that utilizes an electronic assembly support 500, where the electronic assembly support forms a portion of the wall 200. In this embodiment, the electronic assembly support 500 is configured to conduct thermal energy from the electronic assembly 120 from one side of the wall (the front side of the wall) to the other side of the wall (the back side of the wall), and thus the module case assembly is therefore adapted to conduct thermal energy from a first side of the module case wall to a second side of the module case wall.

Figure 7:
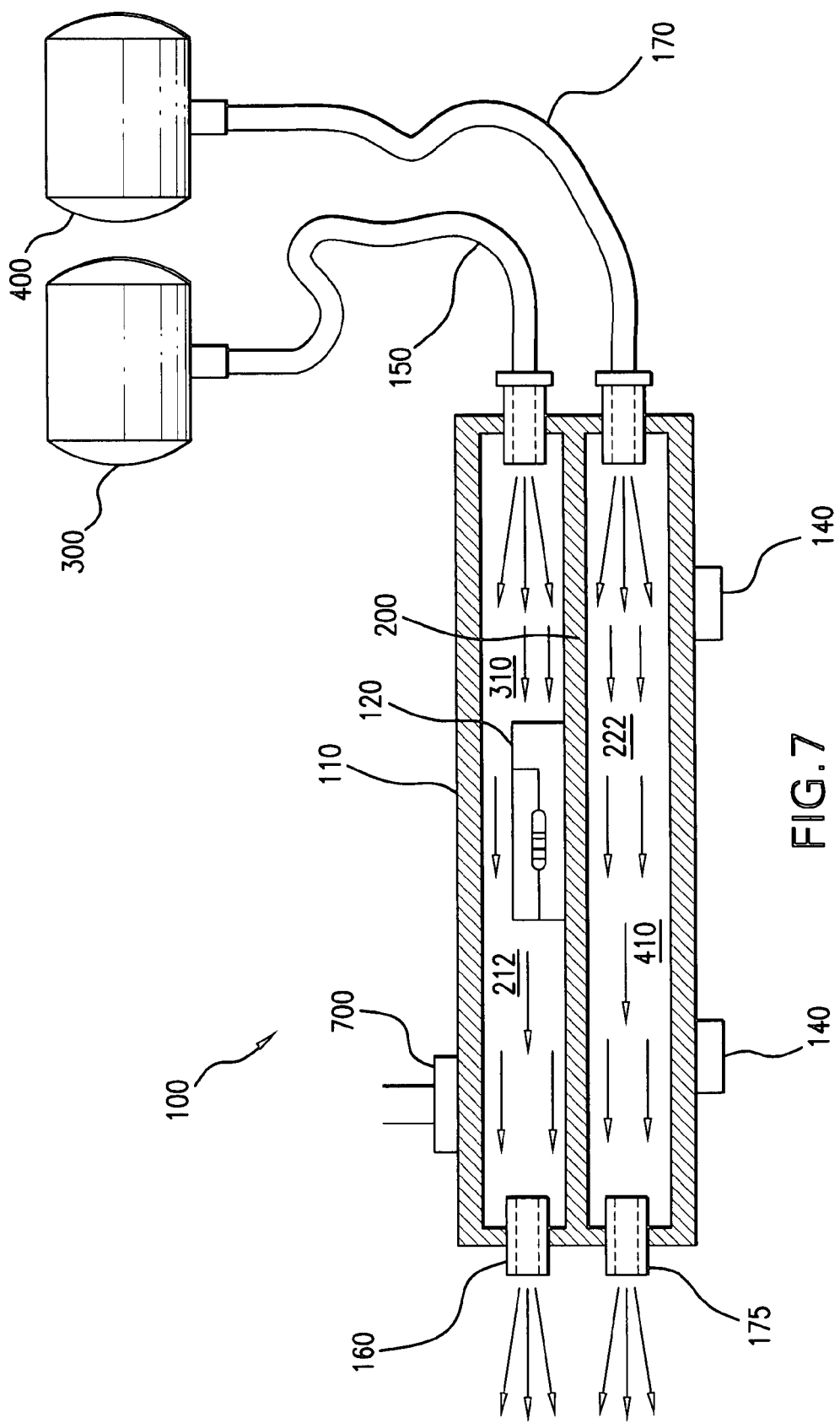
FIG. 7 shows another embodiment of the present invention, where the module case assembly is in an effectively self-contained modularized form.

Another embodiment of the present invention may be seen in FIG. 7. The principal of operation of FIG. 7 is substantially the same as that of FIG. 1. However, the embodiment of FIG. 7 differs from that of FIG. 1, by way of example, in that instead of placing the module case assembly 110 in a duct 170 or exposing it to an exterior, quasi-all enveloping or side enveloping air stream/air flow 410, the module case assembly 110 is bifurcated into two portions/cavities that are effectively air-tight with respect to each other. These two portions are separated by at least wall 200. The first portion/cavity 212 containing the electronic assembly 120. The second portion 222 is located in-back of the wall 200. A duct 150 directs air from an air driver 300, such as for example, a compressor 300 and/or a compressed air tank and or a fan, etc., into the portion 212 of the module case assembly 110. This air exits duct 160. Thus air is permitted to flow past electronic assembly 120, and therefore, effectively cool electronic assembly 120.

Duct 170 directs air from air driver 400 which may be for example, a compressor and/or a compressed air tank and/or a fan etc., separate from the air driver 300, into the portion 222 of the module case assembly 110. This air exits duct 175. Thus, air is permitted to flow past wall 200. As will be readily understood, because the electronic assembly cooling system is adapted to permit thermal energy to be conducted from the side of the wall 200 where the electronic assembly 120 is located (the front side) to the opposite side of the wall (the back side of the wall), the effective redundant cooling as described with respect to the embodiment of FIG. 1 is achieved.

The embodiment of FIG. 7 may be used in a highly moduelized system where the module case assembly 110 may be located substantially anywhere (e.g., it does not need to be installed in a duct that blows cool air over the module case assembly) and air hoses/ducts may be connected to the module case assembly.

As may be seen in FIG. 7, module case assembly 110 may include an input-output device 700 in electrical communication with the electronic assembly 120. FIG. 7 also shows fittings 140 that enable the module case assembly 110 to be connected to a structure that has mating fittings adapted to connect to fittings 140. Thus, in an embodiment utilizing a device according to FIG. 7, the module case assembly 110 may be installed, for example, in an air vehicle in three simple steps: first, connecting the module case assembly to structure of the air vehicle utilizing fittings 140; second, connecting air sources to the module case assembly 110 in two locations and third, placing the input/output device in electrical communication with other components, especially other electrical components, of the air vehicle. In an optional additional step, exhaust hoses may be connected to the module case assembly at ducts 160 and 175. Such an embodiment, as that shown in FIG. 7, permits ease of replacement of the module case assembly 110 and thus may drastically reduce weight in that a large duct assembly such as that shown in FIG. 1 is not used.

In yet other embodiments of the present invention, the air may be re-circulated through the module case assembly. That is, the electronic assembly cooling system may be a closed system where the air flow through portion 212 recycles, and the same is the case for the air flow through cavity 220. In such an embodiment, the recirculated air may be directed, after passing through the case 110, through ducting having sufficient heat transfer properties such that the heated air that exits the module case assembly is effectively cooled prior to re-entering the module assembly, thus ensuring that the electronic assembly does not over heat due to ever increasing air temperature.

Figure 8:
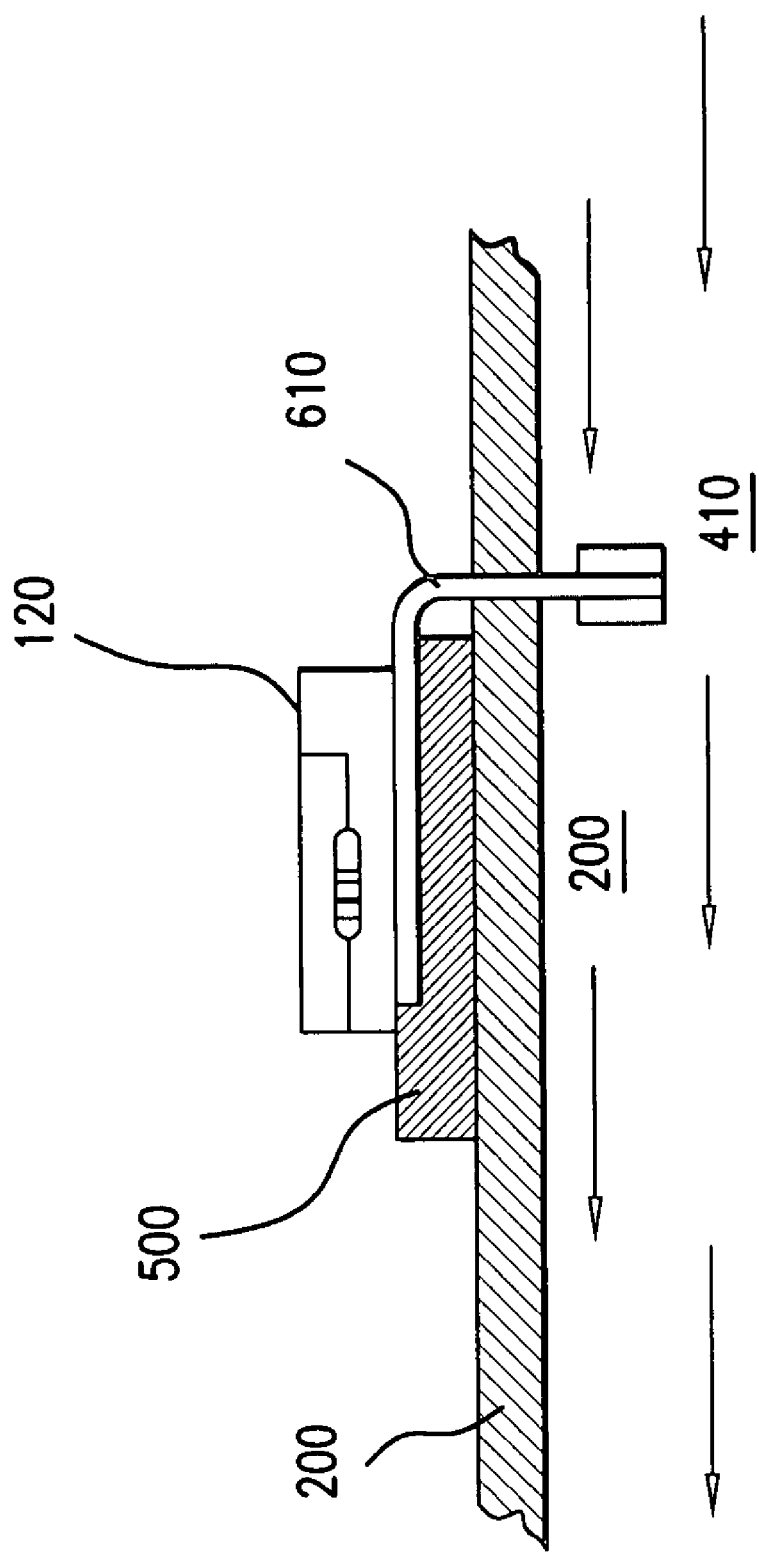
FIG. 8 shows another embodiment of the present invention utilizing a support and fins, where the support and/or the wall is of a high impedance material.

FIG. 8 shows yet another embodiment of the present invention where an electronic assembly is positioned on a support 500 that is connected to a module case wall 200. In the embodiment of the invention shown in FIG. 8, support 500 and/or wall 200 may be of a material that has low thermal energy conductivity properties (i.e., high impedance). Such an embodiment may utilize a fin assembly 610 to conduct heat away from the electronic assembly 120 through the module case wall 200 to the other side 220 of the module case wall 200 where it may be cooled by the air stream 410. Such an embodiment may be utilized in situations where, for example, for packaging purposes, the electronic assembly is located at a distance from the wall 200. In other embodiments of the present invention, a design according to FIG. 8 may be used to enhance thermal conductivity even when support 500 and wall 200 are adapted to conduct thermal energy from the electronic assembly 120 to the far side 220 of the wall 200.

It is noted that the term "duct" as used here is meant to be a broad term. This term encompasses both the traditional concept of a duct (e.g., central-air ducting that may be used, for example, in a central air system) as well as non traditional ducts. According to some embodiments of the invention, the term "duct" encompasses any device or assembly that permits air to be directed from one location to another when driven by a air driver so that convection heat transfer may be obtained.

The phrase "effectively leaking" and the derivations thereof as used herein means that leakage is sufficiently small or inconsequential that the invention may be practiced so that the electronic assembly may be effectively cooled as disclosed herein. In this regard, an electronic assembly shall be considered to be effectively cooled/effective heat transfer (or derivations of these phrases as used herein) shall be considered to take place when the electronic assemble can operate for a sufficient period of time at an expected ambient temperature without overheating.

It is noted that the embodiments of FIGS. 1-8 may all be considered to be usable in an electronic assembly cooling system that is adapted to direct air driven by the first air driver past the module case wall in-front of the module case wall to effectively cool the electronic assembly via convective heat transfer, wherein the electronic assembly cooling system is adapted to direct air driven by the second air driver past the module case wall in-back of the module case wall to transfer the thermal energy conducted from the electronic assembly from in-front of the module case wall to in-back of the module case wall to the air driven by the second air driver via conductive heat transfer to effectively cool the electronic assembly.

It is noted that while the embodiments of FIG. 1 shows the airflows basically traveling parallel to each other, other embodiments may utilize airflows that are perpendicular and/or orthogonal to one another. By way of example only, with reference to FIG. 1, instead of having the airflow 310 flow as shown, the airflow 310 might enter and exit the module 110 in/out of the page, respectively. Still further by example, the airflow 310 might enter the module 110 from the top and exit from the bottom (or visa-versa) or the airflow 410 might be directed from the top to the bottom, or visa-versa.

It is to be noted that some embodiments of the invention may be practiced with no plenum above and/or below the module case assembly for the first airflow, a plenum for the secondary airflow or backup fan air supply might utilize a plenum. By way of example, a lower plenum might be utilized for updraft airflow. For aircraft installation, a top surface hood may be utilized to protect against water and foreign material entry into the electronics module. A reduced cabinet space be achieved if the design utilizes only one airflow.

In some embodiments of the invention, the module will be grounded to obtain low impedance between the module and ground. For example, in some embodiments, a 5 milli-ohm ground bond will be utilized.

Figure 9:
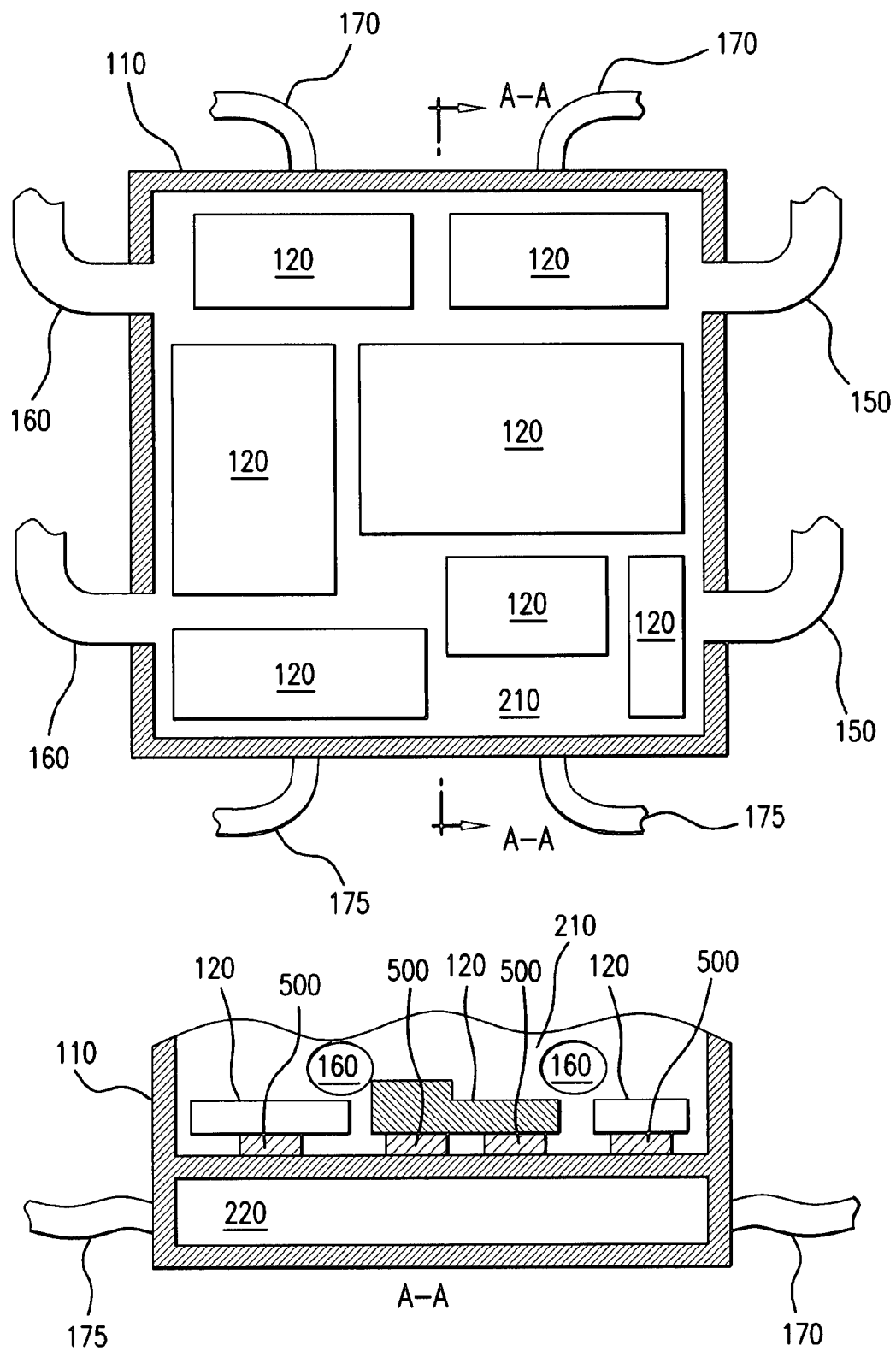
FIG. 9 presents another embodiment of the present invention where multiple electronic assemblies are housed in the module case.
Figure 10:
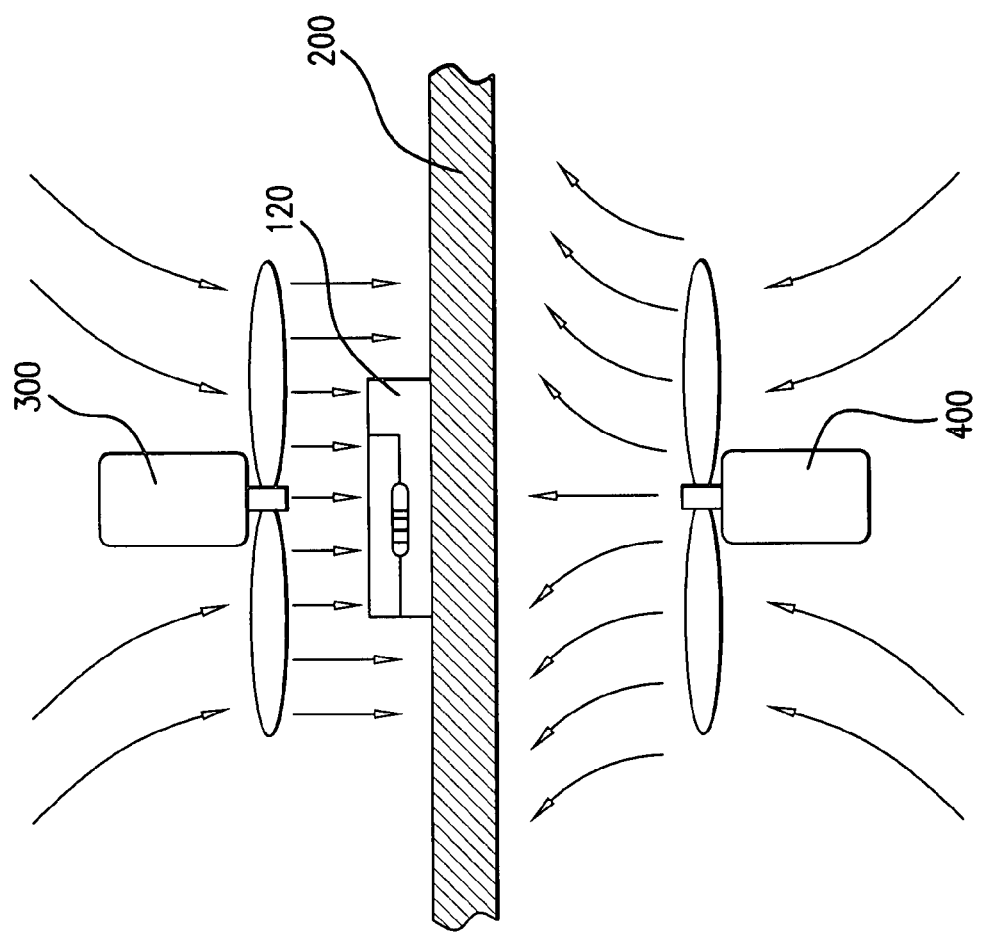
FIG. 10 presents another embodiment of the present invention.

FIG. 9 presents another embodiment of the present invention, where multiple electronic assemblies 120 are housed in the module case assembly 110. As may be seen, this embodiment includes two ducts 150 and two ducts 160. FIG. 10 also presents another embodiment of the present invention, where air driver 300 is located above and on the same side of wall 200 as electronic assembly 120, and air driver 400 is located below and on the opposite side of wall 200 as electronic assembly 120.

Figure 16:
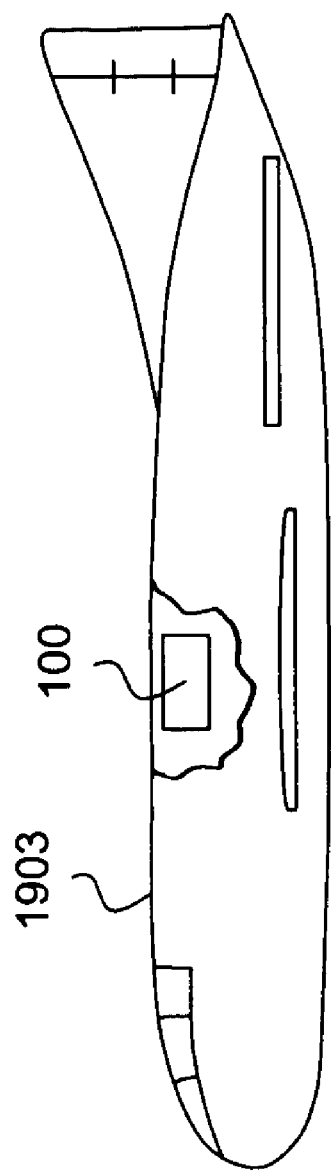

FIG. 16 presents an air vehicle 1903 utilizing an electronics assembly cooling system 100 according to an embodiment of the present invention.

Figure 11:
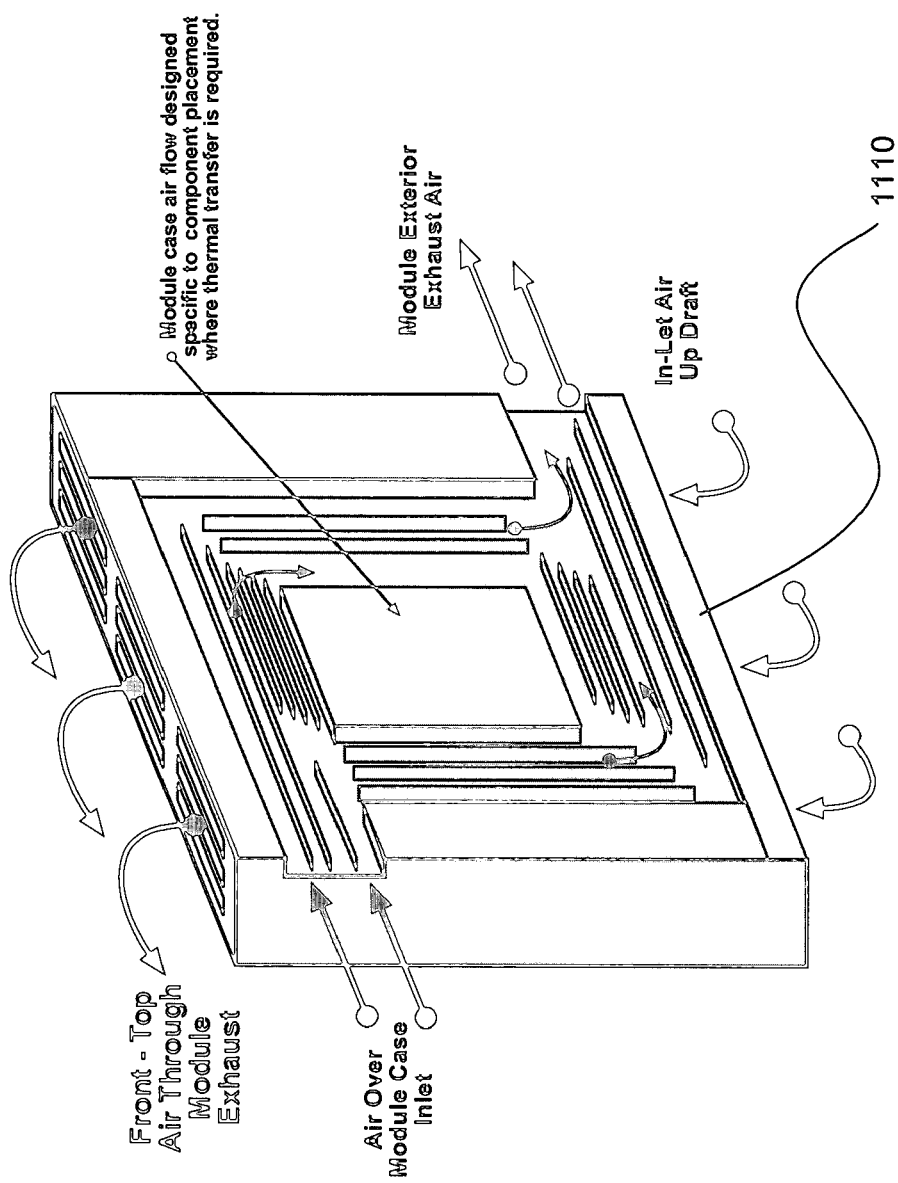
Figure 12:
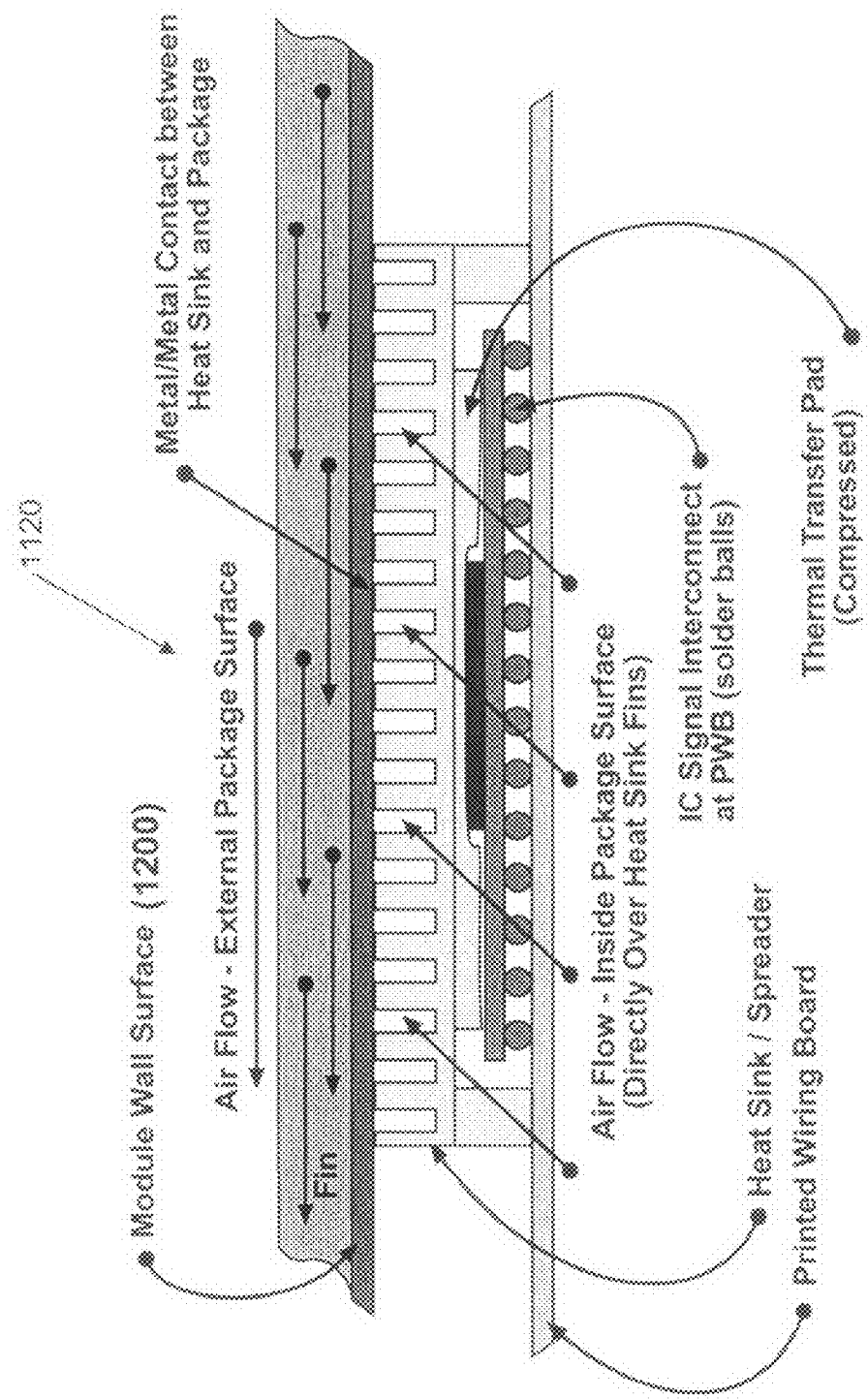
Figure 13:
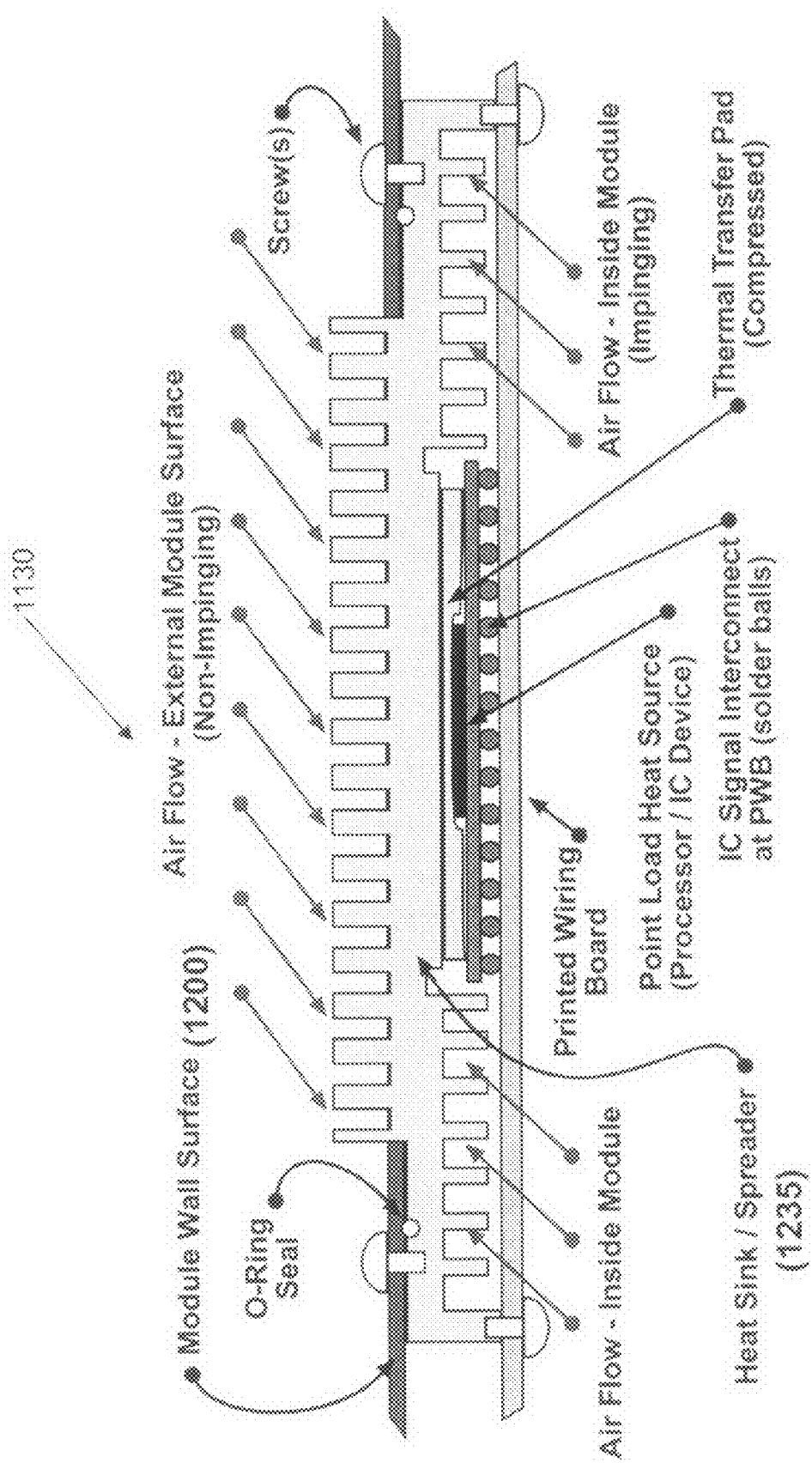

FIG. 11 depicts another embodiment of the invention, where a module case assembly 1110 is shown with air traveling through the case and air traveling over the case. FIG. 12 depicts a cross-section of a portion of a module case 1120 according to another embodiment of the present invention, where wall 1200 separates the non-impinging air flow from the impinging air flow. FIG. 13 depicts a cross-section of a portion of a module case 1130 according to another embodiment of the present invention, where wall 1200 and heat sink/spreader 1235 separates the non-impinging and impinging air flows.

FIG. 14 depicts a cross-section of a portion of a module 1140 and a portion of a module 1150 according to another embodiment of the present invention, where an adjacent exterior external package surface (e.g., a wall of another module case) of the module 1150 serves as a guide surface/upper boundary for the non-impinging air of module 1140. FIG. 15 depicts a cross-section of a portion of a module 1160 and a portion of a module 1170 according to another embodiment of the present invention, where the region between the modules serves as a guide surface/boundary for the non-impinging air. That is, in the embodiment of FIG. 15, the non-impinging air is shared between the module 1170 and 1160.

It will be noted that some embodiments of the present invention may be used with land vehicles and sea vehicles as well. It is further noted that some or all embodiments of the present invention may be utilized with the teachings of the U.S. Patent Application entitled Method for Electronic Equipment Cooling Having Improved EMI Control and Reduced Weight (referenced above), by David Hartung, filed on the same date as this application.

Given the disclosure of the present invention, one versed in the art would appreciate that there are other embodiments and modifications within the scope and spirit of the present invention. Accordingly, all modifications attainable by one versed in the art from the present disclosure within the scope and spirit of the present invention are to be included as further embodiments of the present invention.

What is claimed is:

1. An electronic assembly cooling system, comprising:
   a module case assembly including a module case wall;
   a first air driver;
   a second air driver; and
   an electronic assembly located in-front of the module case wall;
   wherein the electronic assembly cooling system is adapted to conduct thermal energy from the electronic assembly from in-front of the module case wall to in-back of the module case wall;
   wherein the electronic assembly cooling system is adapted to direct air driven by the first air driver past the module case wall in-front of the module case wall to effectively cool the electronic assembly via convective heat transfer; and
   wherein the electronic assembly cooling system is adapted to direct air driven by the second air driver past the module case wall in-back of the module case wall to transfer the thermal energy conducted from the electronic assembly from in-front of the module case wall to in-back of the module case wall to the air driven by the second air driver via conductive heat transfer to effectively cool the electronic assembly.

2. The assembly of claim 1, wherein the air driven by first air driver past the module case wall in-front of the module case wall is effectively separated, in an airtight manner, from the air driven by the second air driver past the module case wall in-back of the module case wall.

3. The assembly of claim 1, wherein the module case assembly includes a first cavity and a second cavity separated by at least the module case wall in an effectively air tight manner, wherein the electronic assembly is located in the first cavity, wherein the first cavity includes an opening adapted to receive air driven by the first air driver, and wherein the second cavity includes an opening adapted to receive air driven by the second air driver.

4. The assembly of claim 3, wherein the assembly further includes first and second ducts respectively extending from at least the first and second air drivers.

5. The assembly of claim 4, wherein the first cavity includes an opening adapted to permit air driven into the first cavity by the first air driver to exit the second cavity, and wherein the second cavity includes an opening adapted to permit air driven into the second cavity by the second air driver to exit the second cavity.

6. The assembly of claim 1, wherein the electronic assembly is in effective thermal conductive communication with at least one of (i) the back surface, from the perspective of the electronic assembly, of the module case wall, and (ii) a component located in-back of the module case wall.

7. The assembly of claim 6, wherein the electronic assembly is in effective thermal conductive communication with the back surface of the module case wall, and wherein the electronic assembly cooling system is adapted to direct air driven by the second air driver against the back surface of the module case wall.

8. The assembly of claim 6, wherein the electronic assembly is in effective thermal conductive communication with a component located in-back of the module case wall.

9. The assembly of claim 6, wherein the electronic assembly is in effective thermal conductive communication with a component located in-back of the module case wall, and wherein the electronic assembly cooling system is adapted to direct air driven by the second air driver against the component located in-back of the module case wall.

10. The assembly of claim 6, wherein a support adapted to support the electronic assembly is located between the electronic assembly and the wall, the support being adapted to effectively conduct thermal energy from the electronic assembly to the wall.

11. The assembly of claim 1, wherein the air driven by the second air driver effectively does not come into contact with the electronic assembly.

12. An air vehicle, comprising:
an airframe; and
an electronic assembly cooling system according to claim 1.

13. The air vehicle of claim 12, wherein the electronic assembly cooling system comprises an air duct in air communication with the second air driver, wherein the air duct is adapted to direct air driven by the second air driver past the module case wall in-back of the module case wall to transfer the thermal energy conducted from the electronic assembly from in-front of the module case wall to in-back of the module case wall to the air driven by the second air driver via conductive heat transfer to effectively cool the electronic assembly.

14. The air vehicle of claim 13, wherein the wall of the module case assembly is located substantially inside the air duct.

15. The air vehicle of claim 12, wherein the electronic assembly cooling system comprises a first air duct in air communication with the first air driver, wherein the air duct is adapted to direct air driven by the first air driver past the module case wall in-front of the module case wall to effectively cool the electronic assembly via convective heat transfer, wherein the electronic assembly cooling system comprises a second air duct in air communication with the second air driver, wherein the second air duct is adapted to direct air driven by the second air driver past the module case wall in-back of the module case wall to transfer the thermal energy conducted from the electronic assembly from in-front of the module case wall to in-back of the module case wall to the air driven by the second air driver via conductive heat transfer to effectively cool the electronic assembly.

16. An electronic assembly cooling system, comprising:
a module case assembly including:
a module case wall; and
an electronic assembly support that is at least one of (i) a portion of the module case wall (ii) attached to the module case wall, and (iii) extended through the module case wall;
a first air driver; and
a second air driver;
wherein the module case assembly is adapted to conduct thermal energy from a first side of the module case wall to a second side of the module case wall;
wherein the electronic assembly cooling system is adapted to direct air driven by the first air driver past the module case wall on the first side of the module case wall; and
wherein the electronic assembly and cooling system is adapted to direct air driven by the second air driver past the module case on the second side of the module case wall.

17. The assembly of claim 16, wherein the electronic assembly cooling system is adapted to transfer thermal energy through the electronic assembly support and through the module case wall away from the electronic assembly support.

18. An electronic assembly cooling system according to claim 1, wherein the electronic assembly cooling system is adapted to effectively cool the electronic assembly by directing air driven by the first air driver past the module case wall in-front of the module case wall without directing air driven by the second air driver past the module case wall in-back of the module case wall, and wherein the electronic assembly cooling system is adapted to effectively cool the electronic assembly by directing air driven by the second air driver past the module case wall in-back of the module case without directing air driven by the first air driver past the module case wall in-front of the module case wall.

19. A method of providing redundant cooling of an electronic assembly, comprising:
directing a first air stream against an electronic assembly, the first air stream being generated by a first air driver, wherein the first air stream alone is sufficient to effectively cool the electronic assembly;

directing a second air stream across a surface in thermal conductive communication with the electronic assembly, the second air stream being generated by a second air driver separate from the first air driver, wherein the second air stream alone is sufficient to effectively cool the electronic assembly.

20. The method of claim 19, further comprising effectively maintaining a separation between the two air streams, the separation being effectively air tight.

* * * * *